United States Patent
Bogner et al.

(10) Patent No.: US 8,564,470 B2
(45) Date of Patent: Oct. 22, 2013

(54) SUCCESSIVE APPROXIMATION ANALOG-TO-DIGITAL CONVERTER

(75) Inventors: Peter Bogner, Wernberg (AT); Franz Kuttner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 101 days.

(21) Appl. No.: 13/160,357

(22) Filed: Jun. 14, 2011

(65) Prior Publication Data

US 2012/0319878 A1 Dec. 20, 2012

(51) Int. Cl.
*H03M 1/34* (2006.01)

(52) U.S. Cl.
USPC .................................. 341/163; 341/155

(58) Field of Classification Search
USPC .................. 341/144, 155, 163, 135, 136; 324/76.11; 327/427; 323/268, 283
See application file for complete search history.

(56) References Cited

U.S. PATENT DOCUMENTS

| | | | | |
|---|---|---|---|---|
| 4,114,149 | A * | 9/1978 | Kendall | 341/127 |
| 5,717,321 | A * | 2/1998 | Kerth et al. | 323/283 |
| 5,831,562 | A * | 11/1998 | Van Auken et al. | 341/122 |
| 6,400,607 | B1 * | 6/2002 | Pasotti et al. | 365/185.21 |
| 6,747,588 | B1 * | 6/2004 | Huang et al. | 341/156 |
| 6,963,188 | B2 * | 11/2005 | Wich | 323/268 |
| 7,209,069 | B2 * | 4/2007 | Felder | 341/163 |
| 2010/0007328 | A1 * | 1/2010 | Sander et al. | 324/76.11 |
| 2010/0194462 | A1 * | 8/2010 | Petruzzi et al. | 327/427 |

* cited by examiner

*Primary Examiner* — Peguy Jean Pierre
(74) *Attorney, Agent, or Firm* — Slater & Matsil, L.L.P.

(57) ABSTRACT

A current input analog-to-digital converter and a corresponding current measurement circuit is disclosed. In accordance with one example of the invention, an analog-to-digital conversion circuit includes a register for storing a digital register value and a digital-to-analog converter that is configured to provide a reference current at a circuit node which is set in accordance to the digital register value. The electric potential of the input node is responsive to the reference current set. A comparator circuit is configured to compare the potential of the circuit node with at least one threshold, thus assessing whether the potential of the circuit node is at least approximately at a desired value. Control circuitry is responsive to the comparator circuit and is configured to adjust the digital register value stored in the register and to adjust the reference current until the comparator indicates that the potential of the circuit node does not deviate from the desired value.

21 Claims, 3 Drawing Sheets

SUCCESSIVE APPROXIMATION ANALOG-TO-DIGITAL CONVERTER

TECHNICAL FIELD

The present disclosure relates to analog-to-digital converters, for example, for use in current measurement applications that produce a digital measurement value representative of the sought current value.

BACKGROUND

Many different types of analog-to-digital converters (ADCs) are known such as direct conversion ADCs, successive-approximation ADCs, ramp-compare ADCs (e.g., single slope ADC), integrating ADCs (e.g., dual slope ADC) to name but a few. However, all common ADCs are designed to convert analog voltage values into corresponding digital values. When current values are to be digitized the current whose value is sought is supplied to a resistor of a well defined resistance resulting in a respective voltage drop across the resistor equal to the product of the sought current and the resistance. The voltage drop is then digitized by an ADC. One consequence of the above-described current measuring approach is that the resistance value of the resistor is introduced into the measurement results. Thus, systematic errors are introduced in the measurement result when the actual resistance deviates from its desired nominal value which is always the case as the resistance value is subject to unavoidable production tolerances.

Thus, there is a general need for improved analog-to-digital converters which are designed to convert current values and which provide digital measurement values.

SUMMARY OF THE INVENTION

A current input analog-to-digital converter and a corresponding current measurement circuit is disclosed. In accordance with one example of the invention, an analog-to-digital conversion circuit includes a register for storing a digital register value and a digital-to-analog converter that is configured to provide a reference current at a circuit node which is set in accordance to the digital register value. The electric potential of the input node is responsive to the reference current set. A comparator circuit is configured to compare the potential of the circuit node with at least one threshold, thus assessing whether the potential of the circuit node is at least approximately at a desired value. Control circuitry is responsive to the comparator circuit and is configured to adjust the digital register value stored in the register and to adjust the reference current until the comparator indicates that the potential of the circuit node does not deviate from the desired value.

Further, a semiconductor chip is disclosed. The chip is integrated in a first chip package and comprises at least one external pin for receiving a current measurement signal in the current domain provided by a sense transistor. The sense transistor is coupled to a corresponding load transistor and both transistors are integrated in a separate second chip package providing the measurement signal in the current domain via an external pin of the second chip package. The semiconductor chip comprises circuitry configured to receive the current measurement signal and to provide a digital representation thereof.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
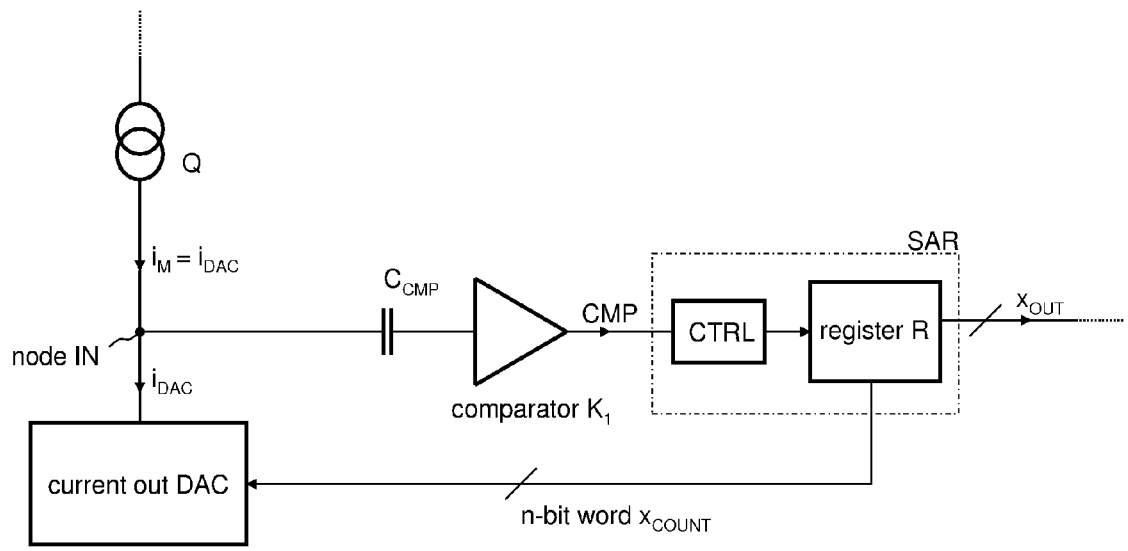
FIG. 1 is a block diagram illustrating an ADC circuit in accordance with a first example of the invention.

FIG. 1 is a block diagram of an analog-to-digital conversion circuit that is capable of converting an input current to be measured (further denoted as measurement current $i_M$) into a digital value $x_{OUT}$ (i.e. an n-bit binary word) that is representative of the actual measurement current value. In the example of FIG. 1 an ideal current source Q symbolized the (real world) source that provides the measurement current $i_M$.

The circuit includes a current output digital-to-analog converter DAC that provides (or sinks), a circuit node IN, a reference current $i_{DAC}$ which is an analog representation of a digital register value $x_{COUNT}$. The electric potential present at the circuit node IN is floating and may be initialized to an appropriate (e.g., quiescent) value (initialization is not shown in FIG. 1). When the current output digital-to-analog converter DAC is activated and when its output current $i_{DAC}$ is exactly equal to the measurement current $i_M$, then the activation of the digital-to-analog converter DAC has no effect and the electric potential of the circuit node IN remains (approximately) at its initial value. However, when the output current $i_{DAC}$ of the digital-to-analog converter DAC is set too low, then the electric potential of the circuit node IN will rise to an upper saturation level. Inversely, when the output current $i_{DAC}$ of the digital-to-analog converter DAC is set too high, then the electric potential of the circuit node IN will fall to a lower saturation level. That is, monitoring the potential of the circuit node IN allows for assessing whether the output current $i_{DAC}$ of the digital-to-analog converter DAC is "correctly" set.

A comparator circuit is configured to compare the input potential of the circuit node IN with one or more predefined threshold levels and to signal whether the output current $i_{DAC}$ of the digital-to-analog converter DAC is set correctly or not. Further, the comparator may indicate whether the output current $i_{DAC}$ of the digital-to-analog converter DAC is set too high or too low.

For this purpose the comparator circuit may include a comparator $K_1$ having an input that is capacitively coupled to the input circuit node IN via (an optional) coupling capacitor $C_{CMP}$. As mentioned before, the potential at the node IN, as well as the potential directly at the comparator's input may be initialized to appropriate values (for example, to the quiescent point of the comparator's $K_1$ input stage). This initialization may be done using appropriately configured semiconductor switches (not shown). The comparator $K_1$ may exhibit a (narrow) hysteresis so as to avoid toggling.

It should be noted that the measurement current $i_M$ which is supplied to the circuit node IN and current $i_{DAC}$ which is drained by the digital-to-analog-converter DAC drains are always the same such that the "residual current" $i_D = i_M - i_{DAC}$ is zero always (or at least nearly zero) as the comparator $K_1$ has a high resistance input.

The coupling capacitor allows for DC decoupling the comparator $K_1$ from the circuit node IN. If the comparator $K_1$ is not triggered, then the current $i_M$ (forced to be equal to $i_{DAC}$ by the digital-to-analog converter DAC) is at its correct level and the digital register value $x_{COUNT}$, which is representative for the reference current $i_{DAC}$, can be taken as digital measurement result. Consequently, the digital output word $x_{OUT}$ is set to the current value of the register value $x_{COUNT}$ when the current $i_M$ is set correctly by the digital-to-analog converter DAC.

The analog-to-digital conversion circuit of FIG. 1 further includes a register R for storing the digital register value $x_{COUNT}$ as well as a control circuit CTRL that is responsive to the comparator circuit's output. The control circuit CTRL and the register R are collectively depicted as successive approximation register SAR in the example of FIG. 1. However, other types of register may be employed, too. The successive approximation register SAR is configured to vary the content of the register (i.e., the digital register value $x_{COUNT}$) and thus the reference current $i_{DAC}$ as long as the comparator circuit indicates (e.g., via the comparator output signal CMP) an incorrect setting of the DAC output current $i_{DAC}$. Further, the successive approximation register SAR is configured to provide the digital register value as digital output word $x_{OUT}$ when the comparator circuit indicates a match, i.e., a correct setting of the DAC output current $i_{DAC}$.

The mentioned varying of the register value $x_{COUNT}$ may differ in different examples of the present invention. For example, the register value $x_{COUNT}$ may be initialized to zero after a initialization (e.g., discharging or charging to a predefined level) of the capacitor $C_{CMP}$. Subsequently, the value $x_{COUNT}$ may be increased by steps of one as long as the comparator circuits indicates a mismatch. When the comparator indicates a match, the register value $x_{COUNT}$ is forwarded to the SAR output where it is provided as output word $x_{OUT}$ for further digital data processing. Then the next analog-to-digital conversion cycle may start over by reinitializing the register value $x_{COUNT}$ and the coupling capacitor $C_{CMP}$. The switches required for initializing the capacitor $C_{CMP}$ are not shown for the sage of simplicity.

Figure 2:
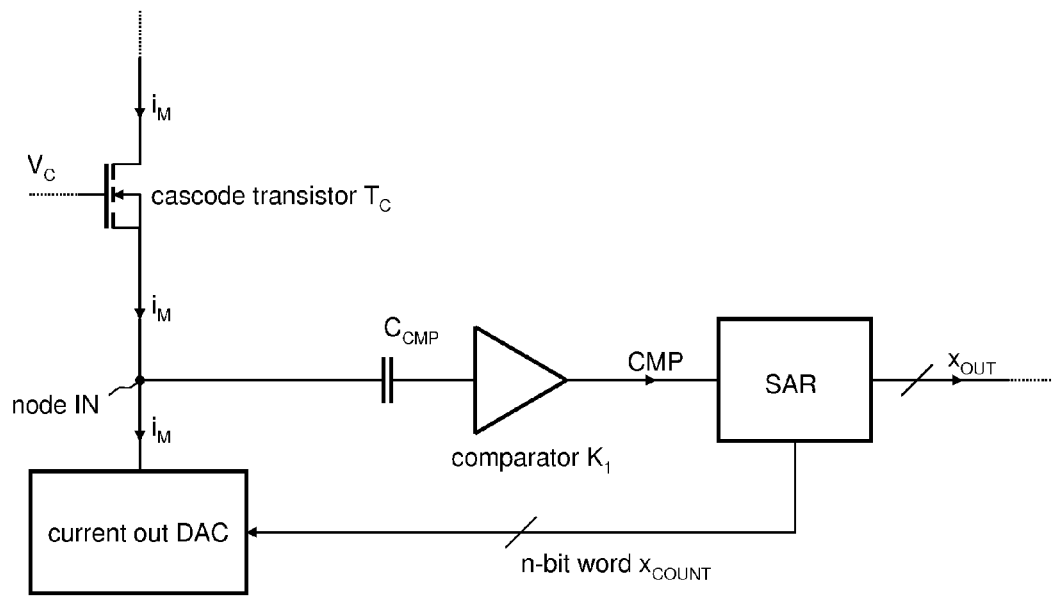
FIG. 2 is a block diagram illustrating an ADC circuit in accordance with a second example of the invention.

FIG. 2 illustrates an analog-to-digital conversion circuit very similar to the example of FIG. 1. The example of FIG. 2 differs from the example of FIG. 1 only in that the measurement current $i_M$ is provided to the input circuit node IN via the load path of a cascode transistor, e.g., via the drain-source path of a field effect transistor $T_C$. This is particularly useful when the measurement current $i_M$ is provided by a circuit operating at high voltages with respect to the electric potentials present in the analog-to-digital conversion circuit. Supplying the measurement current $i_M$ to the input circuit node IN via the cascode transistor $T_C$ allows for using low voltage devices in the analog-to-digital conversion circuit except for the cascode transistor $T_C$ which takes over the high voltage drop. The control electrode (e.g., the base) of the cascode transistor may be biased with a constant bias voltage $V_C$.

Figure 3:
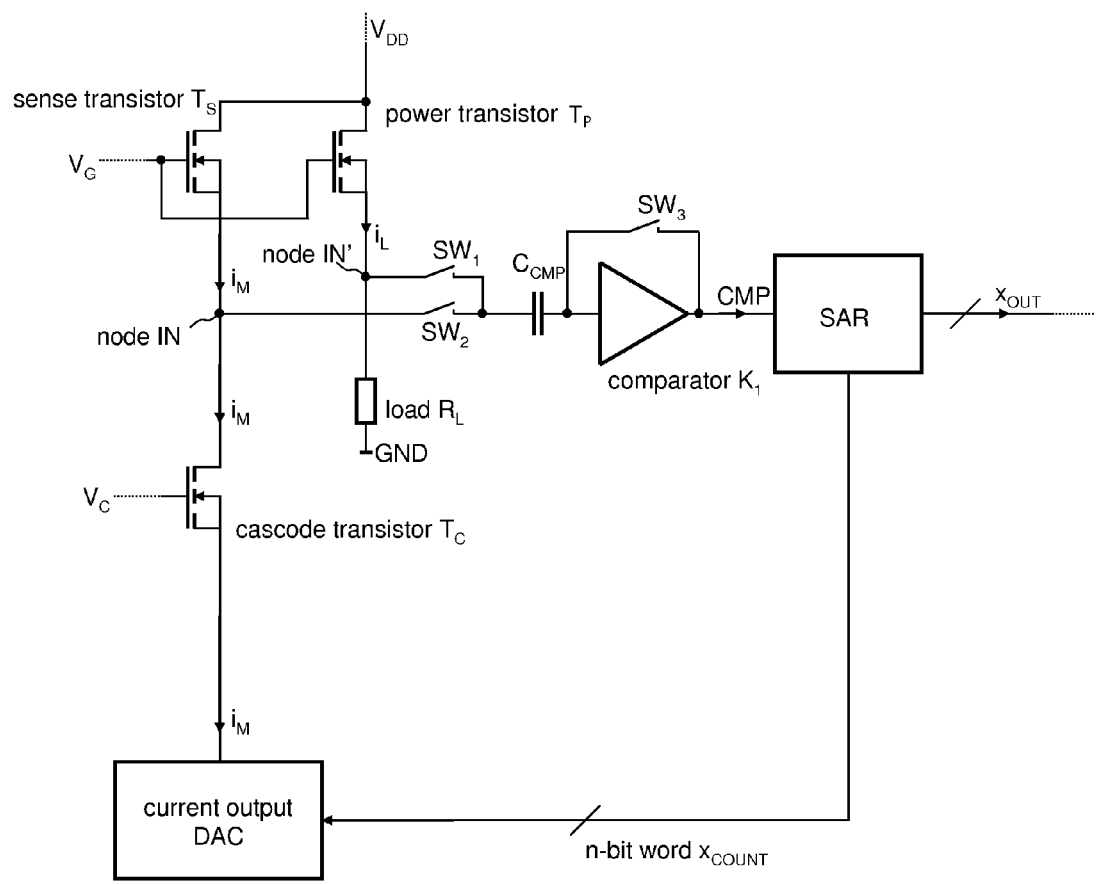
FIG. 3 is a block diagram illustrating a current measurement circuit in accordance with one example of the invention.

FIG. 3 illustrates a current measurement circuit in which an analog-to-digital conversion circuit in accordance with the example of FIG. 2 is usefully employed. The current measurement circuit makes use of a so-called sense-transistor arrangement which is commonly used for measuring high currents flowing through a power transistor (see, for example, publication U.S. Pat. No. 5,023,693).

A sense-transistor arrangement can be used for measuring the load current $i_L$ of a power transistor $T_P$ which is usually (but not necessarily) a high side switch having its drain terminal (or collector terminal in case of a bipolar transistor) coupled to an upper supply potential $V_{DD}$ (e.g. the battery voltage in automotive applications) whereas its source terminal (or emitter terminal in case of a bipolar transistor) is coupled to a load (symbolized by load resistor $R_L$ in the present example). The sense transistor $T_S$ is of the same type as the power transistor $T_P$, and both transistors $T_P$, $T_S$ are connected essentially in parallel, i.e., both transistors $T_P$, $T_S$ are supplied with the same gate potential and the same drain potential. Thus both transistors operate in the same quiescent point when their source potential is essentially the same. The latter can be ensured by various measures. The sense transistor has a smaller active area and thus the load current (being the measurement current $i_M$) of the sense transistor $T_S$ is a fraction (e.g. one thousandth) of the load current of the power transistor $T_P$. In practice the power transistors $T_P$ is formed by a plurality of transistor cells coupled in parallel, one or more of which are used to form a sense transistor with a separate source (or emitter) terminal. As mentioned above the measurement current $i_M$ is proportional to the load current $i_L$ when the source terminals of both transistors $T_P$, $T_L$ have the same potential.

In the example of FIG. 3, the cascode transistor is connected between the current output of the digital-to-analog converter DAC and the circuit node IN that is coupled to the comparator via the capacitor $C_{CMP}$ and (additional to the example of FIG. 2) via a switch $SW_2$. Further, the circuit node between the load and source terminal of the power transistor $T_P$ (denoted as circuit node IN') can be capacitively coupled to the comparator $K_1$ via a further switch $SW_1$ and capacitor $C_{CMP}$ such that either the source terminal of the power transistor $T_P$ (switch $SW_1$ closed) or the source terminal of the sense transistor (switch $SW_2$ closed) is connected to the comparator circuit. A switch $SW_3$ allows to initialize the potential of the comparator input to a defined value. In the present example, the capacitor is initialized by closing the switches $SW_1$ and $SW_3$. The switch $SW_3$ short circuits the comparator $K_1$ which forces the potential at the comparator's input to the quiescent point of the comparator's input stage. However, other initialization methods may be applicable.

In order to sample a current value of the measurement current $i_M$ the comparator $K_1$ is first connected (via capacitor $C_{CMP}$) to the circuit node IN', i.e., switches $SW_1$ and $SW_3$ are closed and switch $SW_2$ is open. Thus, the capacitor charges up to a capacitor voltage determined by the source voltage of the power transistor $T_P$. After the capacitor $C_{CMP}$ has reached a steady state the comparator $K_1$ is connected (via the capacitor $C_{CMP}$) to the input circuit node IN (switches $SW_1$ and $SW_3$ are open, switch $SW_2$ is closed). In case the source potentials of both transistors $T_S$ and $T_P$ are identical, the charge of the capacitor $C_{CMP}$ will not change when switching switch $SW_2$ on and switches $SW_1$ and $SW_3$ off, which indicates that the measurement current $i_M$ is exactly proportional to the load current $i_L$. In this case the output current of the DAC is set correctly. In case of a mismatch between the two source potentials, the voltage at the comparator input will change when switching switch $SW_2$ on and switches $SW_2$ and $SW_3$ off. Such a change will be detected by the comparator $K_1$ which will trigger the successive register SAR to vary the digital register value $x_{COUNT}$ so as to adapt the output current of the digital-to-analog converter DAC and thus the current $i_M$ through the sense transistor $T_S$ in a manner already described with respect to FIG. 1. Then the cycle starts over with closing switches $SW_1$ and $SW_3$ and opening switch $SW_2$, charging the capacitor $C_{CMP}$, opening switches $SW_1$ and $SW_3$ and closing switch $SW_2$ and detecting whether the input voltage of the comparator changes. This is done until a current $i_M$ is found such that the source potentials of the transistors $T_P$ and $T_S$ are equal. In this matching state the digital register value is representative of the measurement current $i_M$ which is proportional to the load current $i_L$.

Figure 4:
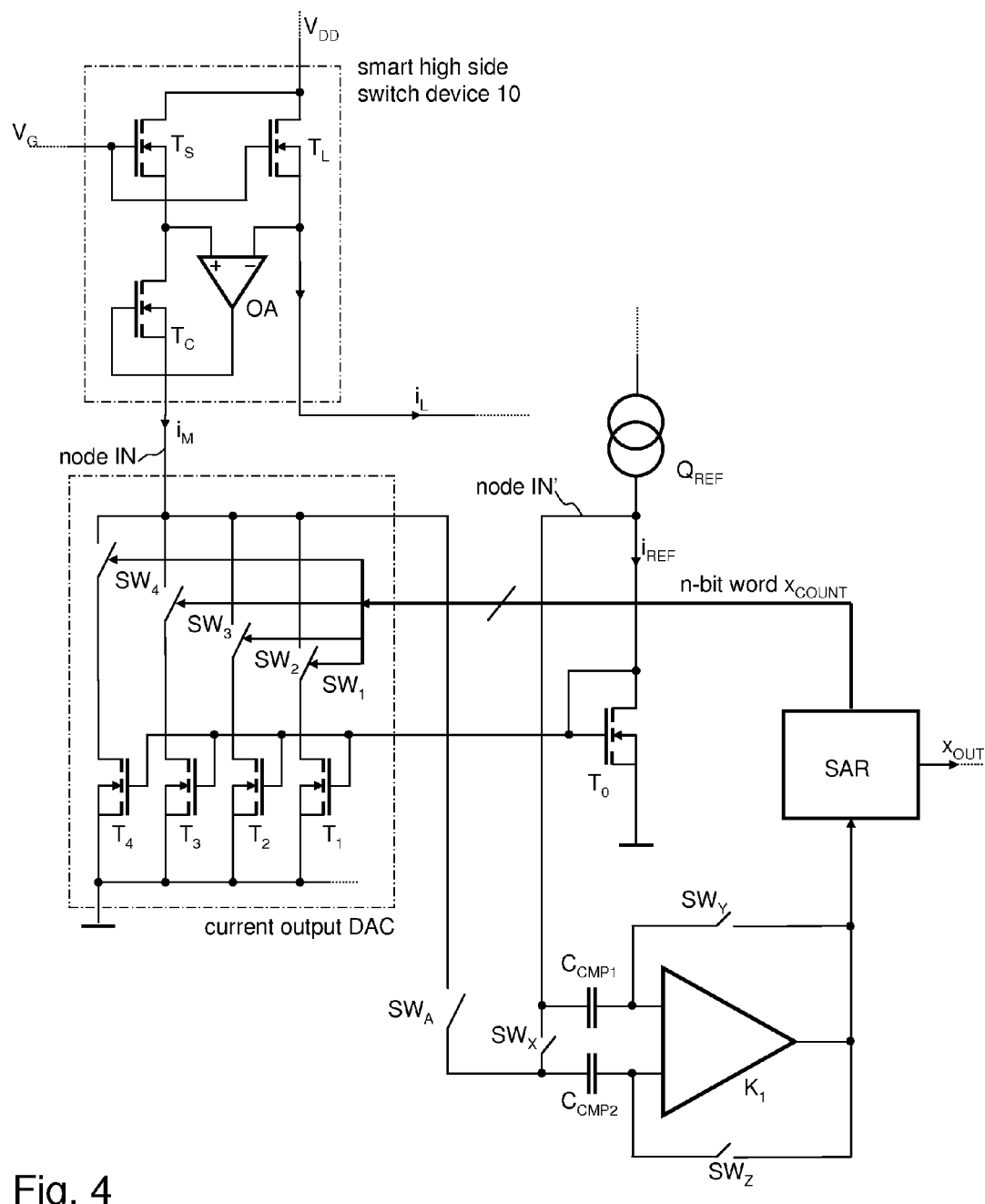
FIG. 4 is a block diagram illustrating a current measurement circuit in accordance with another example of the invention.

A similar example as illustrated in FIG. 3 is illustrated in FIG. 4. The example of FIG. 4 provides the advantage that a load transistor $T_L$ and the sense transistor $T_S$ as well as the cascode transistor $T_C$ (if present) can be integrated in a separate chip. As a result, a measurement of the sense current $i_M$, which is regarded to be representative of the load current $i_L$, can be done at an arbitrary so-called "smart switch" which is a separate device in a separate chip package providing the sense current $i_M$ at an external chip terminal. The load $R_L$ is not shown in FIG. 4.

As in the example of FIG. 3, the measurement current $i_M$ is drained using a current output DAC which is, in the present example, implemented as a multiple output current mirror.

The current minor is formed by the reference current source $Q_{REF}$ providing a reference current $i_{REF}$ to the input transistor $T_0$ of the current mirror, which is coupled to the output transistors $T_1$, $T_2$, $T_3$, $T_4$, etc. In the current only four output transistors are shown for a 0-bit discretized output current. Further current mirror output transistors are required for a higher resolution. The output transistors $T_n$ (n=1, 2, 3, 4, ...) are designed such that they provide $2^{n-1}$ times the reference current $i_{REF}$. That is, transistor $T_1$ ideally provides a drain current $i_{REF}$, transistor $T_2$ provides a drain current $2 \cdot i_{REF}$, transistor $T_3$ provides a drain current $4 \cdot i_{REF}$, transistor $T_4$ provides a drain current $8 \cdot i_{REF}$, and so on. Controllable switches $SW_n$ (n=1, 2, 3, 4, ...) are used to switch the respective output transistor $T_n$ (n=1, 2, 3, 4, ...) to the DAC output circuit node IN where the transistor currents superpose. The switches may be semiconductor switches which are switched on and off in accordance with a binary signal represented by the bits of the n-bit word $x_{COUNT}$ provided by the register SAR as in the example of FIG. 3. For example if $x_{COUNT}$ equals 1001, the load currents of output transistors $T_4$ and $T_1$ contributes to the total DAC output current and thus the output current of the DAC is $9 \cdot i_{REF}$. It should be noted that the DAC current is regarded as an output current (as it is set by the DAC) although the current is actually drained by the DAC.

In contrast to the example of FIG. 3 the potentials of the source nodes of the load transistor $T_L$ and the sense transistor $T_S$ are compared by the comparator $K_1$ (to find out whether the potentials match) as the source node of the sense transistor is not accessible from the outside of the smart switch chip package (smart switch device 10). Instead the drain potential of the current mirror input transistor $T_0$ and the drain potential of the active (switched on) current minor output transistors $T_1$, $T_2$, ... are compared using the comparator $K_1$. Dependent on that comparison the register value $x_{COUNT}$ is varied (e.g., using successive approximation) until the drain potentials match. While the drain potential of the current minor input transistor $T_0$ is at its quiescent point (operating point), the drain potential of the active current mirror output transistors (which is the potential at the DAC current output node) will only assume the same potential when the DAC is set to the "correct" output current. That is, the quiescent points of the transistors will only match when the current $i_M$ drained by the DAC is the same as the sense current would be, when drained through a resistor as it is done in classical sense-FET applications.

The DAC output circuit node which also is the sense output node of the smart switch 10 is denoted as circuit node IN. The reference circuit node at the drain of the current mirror input transistor $T_0$ is denoted as circuit node IN'. The potentials of the nodes IN and IN' are compared using the comparator $K_1$ whereby the comparator is coupled to the nodes via the capacitors $C_{CMP1}$ and $C_{CMP2}$, respectively as illustrated in FIG. 4.

Assuming the capacitors $C_{CMP1}$ and $C_{CMP2}$ coupling the nodes IN and IN' with the respective inputs of the comparator $K_1$ have been initialized to a defined state by closing the switches $SW_X$, $SW_Y$, and $SW_Z$ for a predefined time interval, the capacitor $C_{CMP1}$ is charged to a reference voltage dependent on the potential at the node IN' (i.e., the drain potential of the current mirror input transistor $T_0$). When closing the switch $SW_A$ (which is connected between the capacitor $C_{CMP2}$ and circuit node IN) the capacitor $C_{CMP2}$ is charged to a voltage dependent on the potential of the node IN (i.e., the common drain potential of the active current mirror output transistors $T_1$, $T_2$, T3, etc.). As a result, the capacitor voltages of capacitors $C_{CMP1}$ and $C_{CMP2}$ represent the drain voltages of the current mirror input transistor $T_0$ and the current mirror output transistors $T_1$, respectively.

The comparator $K_1$ is configured to compare the capacitor voltages (and thus the potentials at nodes IN and IN') to check whether the voltages are equal. If yes, the potentials of the circuit nodes IN and IN' are equal, the current mirror operates properly and the measurement current $i_M$ is proportional to the load current $i_L$. Consequently, the digital word $x_{COUNT}$, which determines the actual DAC output current, is also representative (approximately proportional) of the load current and is thus provided as digital output value $x_{OUT}$. If the voltages are not equal (this is signaled to the register SAR by the comparator output) the register value $x_{COUNT}$ is varied and the measurement cycle (beginning with the initialization of the capacitors) starts over. This is repeated until the voltages of the capacitors match. If a matching can not be achieved an error may be signaled. In order to provide the above mentioned functionality the register SAR may be a successive approximation register receiving, from the comparator $K_1$, an input signal which is indicative of whether the voltages compared by the comparator match or, if not, whether the voltage of capacitor $C_{CMP1}$ is higher or lower than the other voltage.

The circuit of FIG. 4 connected to the smart switch 10 can be integrated in one chip together with a digital signal processor or a micro-controller. Such a signal processor or micro-controller chip would require only one external pin to be connected with the sense current output pin of a chip including a smart switch so as to provide a digital current measurement without the need of an external shunt resistor or the like.

Generally, the evaluation of the current signal provided by the sense transistor in the current domain may be performed in a designated semiconductor chip. Such a chip is integrated in a first chip package and comprises at least one external pin for receiving the current measurement signal in the current domain provided by a sense transistor. The sense transistor is coupled to a corresponding load transistor and both transistors are integrated in a separate second chip package which provides the measurement signal in the current domain via an external pin of the second chip package. The semiconductor chip comprises circuitry configured to receive the current measurement signal and to provide a digital representation thereof. For the purpose of providing a digital representation of the current measurement signal the second chip package may include a circuit as illustrated in the example of FIG. 4. However, any other means for converting the current measurement signal in the current domain to a digital register value may be applicable. For example, the measurement current may be drained via a resistor and the resulting voltage drop across the resistor may be digitized. Nevertheless, the current information is exchanged between the two chips in the current domain.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those that have not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An analog-to-digital conversion circuit comprising:
   a register for storing a digital register value;
   a digital-to-analog converter that is configured to provide a reference current at a first circuit node which is set in accordance with the digital register value, an electric potential of the first circuit node being responsive to the reference current set, wherein the first circuit node is configured to receive an input measurement current;
   a comparator circuit that is configured to compare a potential of the first circuit node with at least one threshold, thereby assessing whether the potential of the first circuit node is at least approximately at a desired value;
   control circuitry that is responsive to the comparator circuit and that is configured to adjust the digital register value stored in the register and thus to adjust the reference current until the comparator circuit indicates that the potential of the first circuit node does not deviate from the desired value; and
   a sense transistor coupled to a load transistor, the sense transistor providing a measurement current to the first circuit node, the load transistor providing a load current to a second circuit node.

2. The analog-to-digital conversion circuit of claim 1, wherein the comparator circuit comprises:
   a comparator having a comparator input and a comparator output; and
   a capacitor coupled between the first circuit node and the comparator input.

3. The analog-to-digital conversion circuit of claim 1, further comprising a cascode transistor having a load path that couples the first circuit node and an output of the digital-to-analog converter.

4. The analog-to-digital conversion circuit of claim 1,
   wherein the desired value depends on a potential of the second circuit node; and
   wherein the control circuitry is configured to adjust the digital register value stored in the register and thus to adjust the reference current such that the potential of the first circuit node matches the potential of the second circuit node.

5. The analog-to-digital conversion circuit of claim 1, wherein the comparator circuit comprises:
   a comparator having a comparator input and a comparator output; and
   a capacitor coupled between the first circuit node and the comparator input.

6. The analog-to-digital conversion circuit of claim 5, further comprising:
   a first switch coupling the second circuit node and a first end of the capacitor;
   a second switch coupling the first circuit node and the first end of the capacitor; and
   wherein a second end of the capacitor is connected with the comparator input.

7. The analog-to-digital conversion circuit of claim 5, further comprising a third switch switchable to initialize a charge stored in the capacitor to a value dependent on a potential of the second circuit node.

8. A semiconductor chip integrated in a first chip package and comprising at least one external pin for receiving a current measurement signal in a current domain provided by a sense transistor, wherein the sense transistor is coupled to a corresponding load transistor, both transistors being integrated in a separate second chip package providing the current measurement signal in the current domain via an external pin of the second chip package,
   wherein the semiconductor chip comprises circuitry configured to receive the current measurement signal and to provide a digital representation thereof.

9. The semiconductor chip of claim 8, wherein the circuitry comprises an analog-to-digital converter providing digital representation of the current measurement signal.

10. The semiconductor chip of claim 9, wherein the circuitry comprises a current-to-voltage converter providing a voltage to the analog-to-digital converter, the voltage representative of the current measurement signal in the current domain.

11. The semiconductor chip of claim 10, wherein the current-to-voltage converter is a resistor.

12. The semiconductor chip of claim 9, wherein the analog-to-digital converter comprises a current output digital-to-analog converter configured to drain, at its output, the current measurement signal.

13. The semiconductor chip of claim 12, wherein the current output digital-to-analog converter receives a digital input value in accordance with which the current measurement signal is set.

14. The semiconductor chip of claim 8, further comprising a cascode transistor having a load path that couples the sense transistor and a digital-to-analog converter.

15. The semiconductor chip of claim 8, wherein the sense transistor is configured to provide a measurement current to a digital-to-analog converter, and the load transistor is configured to provide a load current to a circuit node.

16. An analog-to-digital conversion circuit comprising:
   a register for storing a digital register value;
   a digital-to-analog converter that is configured to provide a reference current at a first circuit node which is set in accordance with the digital register value, an electric potential of the first circuit node being responsive to the reference current set;
   a comparator circuit that is configured to compare a potential of the first circuit node with at least one threshold, thereby assessing whether the potential of the first circuit node is at least approximately at a desired value;
   control circuitry that is responsive to the comparator circuit and that is configured to adjust the digital register value stored in the register and thus to adjust the reference current until the comparator circuit indicates that the potential of the first circuit node does not deviate from the desired value; and a cascode transistor having a load path that couples the first circuit node and an output of the digital-to-analog converter.

17. An analog-to-digital conversion circuit comprising:

a register for storing a digital register value;

a digital-to-analog converter that is configured to provide a reference current at a first circuit node which is set in accordance with the digital register value, an electric potential of the first circuit node being responsive to the reference current set;

a comparator circuit that is configured to compare a potential of the first circuit node with at least one threshold, thereby assessing whether the potential of the first circuit node is at least approximately at a desired value;

control circuitry that is responsive to the comparator circuit and that is configured to adjust the digital register value stored in the register and thus to adjust the reference current until the comparator circuit indicates that the potential of the first circuit node does not deviate from the desired value; and a sense transistor coupled to a load transistor, the sense transistor providing a measurement current to the first circuit node, the load transistor providing a load current to a second circuit node.

18. A current measurement circuit comprising:

a sense transistor arrangement with a sense transistor and a load transistor, the sense transistor providing a measurement current to a first circuit node, the load transistor providing a load current to a second circuit node;

a register for storing a digital register value;

a digital-to-analog converter that is configured to set a current at the first circuit node to a reference current in accordance with the digital register value, an electric potential of the first circuit node being responsive to the reference current set;

a comparator circuit that is configured to compare a potential of the first circuit node with at least one threshold, thereby assessing whether the potential of the first circuit node is at least approximately equal to a desired value given by a potential of the second circuit node;

control circuitry that is responsive to the comparator circuit and that is configured to adjust the digital register value stored in the register and thus to adjust the reference current until the comparator circuit indicates that the potential of the first circuit node does not deviate from the desired value; and a cascode transistor having a load path that couples the first circuit node and an output of the digital-to-analog converter.

19. The current measurement circuit of claim 18, wherein the comparator circuit further comprises:

a comparator having a comparator input and a comparator output; and a capacitor coupled between the first circuit node and the comparator input.

20. The current measurement circuit of claim 18, wherein the digital-to-analog converter comprises a plurality of current mirror output transistors coupled such that respective output currents of the current mirror output transistors superpose at the first circuit node; and the threshold is represented by a drain or a source voltage of a current mirror input transistor receiving a predefined fixed reference current determining output currents of the current mirror output transistors.

21. The current measurement circuit of claim 20, wherein the output current of each current mirror output transistor is switchable on and off in accordance with the digital register value.

* * * * *